(12) United States Patent
Lee et al.

(10) Patent No.: US 10,164,311 B2
(45) Date of Patent: Dec. 25, 2018

(54) HIGH FREQUENCY SIGNAL TRANSMISSION DEVICE

(71) Applicant: BELLWETHER ELECTRONIC CORP, Taoyuan (TW)

(72) Inventors: Hsing-Yu Lee, Taoyuan (TW); Hung-Yu Chen, New Taipei (TW)

(73) Assignee: BELL WETHER ELECTRONIC CORP, Taoyuan (TW)

( * ) Notice: Subject to any disclaimer, the term of this patent is extended or adjusted under 35 U.S.C. 154(b) by 0 days.

(21) Appl. No.: 15/661,772

(22) Filed: Jul. 27, 2017

(65) Prior Publication Data

US 2018/0061530 A1 Mar. 1, 2018

(30) Foreign Application Priority Data

Aug. 29, 2016 (CN) .......................... 2016 1 0754182

(51) Int. Cl.
| | |
|---|---|
| *H01B 7/08* | (2006.01) |
| *H01P 3/02* | (2006.01) |
| *H01B 3/44* | (2006.01) |
| *H01B 7/02* | (2006.01) |
| *H01B 7/04* | (2006.01) |
| *H01B 11/00* | (2006.01) |
| *H05K 9/00* | (2006.01) |
| *H01P 3/06* | (2006.01) |
| *H01B 7/17* | (2006.01) |

(52) U.S. Cl.
CPC .............. *H01P 3/02* (2013.01); *H01B 3/441* (2013.01); *H01B 7/0216* (2013.01); *H01B 7/04* (2013.01); *H01B 7/0823* (2013.01); *H01B 7/0861* (2013.01); *H01B 11/00* (2013.01); *H01P 3/06* (2013.01); *H05K 9/0084* (2013.01); *H01B 7/17* (2013.01)

(58) Field of Classification Search
CPC ........................................................ H01B 7/08
USPC .............................. 174/117 F, 117 FF, 117 A
See application file for complete search history.

(56) References Cited

U.S. PATENT DOCUMENTS

| | | | | | |
|---|---|---|---|---|---|
| RE31,477 | E | * | 12/1983 | Marshall ................ | H01B 11/00 174/115 |
| 4,647,714 | A | * | 3/1987 | Goto ...................... | B32B 15/04 174/36 |
| 4,973,794 | A | * | 11/1990 | Steele ................... | H01B 7/0861 174/103 |
| 6,093,894 | A | * | 7/2000 | Carlson ............. | H01L 23/49572 174/117 F |

(Continued)

*Primary Examiner* — Chau N Nguyen
(74) *Attorney, Agent, or Firm* — Li & Cai Intellectual Property (USA) Office (57) ABSTRACT

The instant disclosure relates to a high frequency signal transmission device which includes an insulation cover, at least one flexible flat cable, and an electrical connector assembly. The insulation cover has an accommodation space, the at least one flexible flat cable is disposed in the accommodation space, and the electrical connector assembly is electrically connected to one end of the at least one flexible flat cable. The at least one flexible flat cable includes a plurality of conductors, an insulation layer, a polyolefin resin layer, and a shielding layer. The insulation layer is laminated over the conductors. The polyolefin resin layer is attached to the insulation layer by a first low-k dielectric adhesive layer, and the shielding layer is attached to the polyolefin resin layer by another first low-k dielectric adhesive layer.

19 Claims, 6 Drawing Sheets

(56) References Cited

U.S. PATENT DOCUMENTS

| | | | | |
|---|---|---|---|---|
| 6,501,350 B2* | 12/2002 | Lester | ............... | H01Q 13/206 |
| | | | | 333/237 |
| 6,683,583 B2* | 1/2004 | Ngin | ............... | B32B 7/02 |
| | | | | 343/897 |
| 6,704,816 B1* | 3/2004 | Burke | ............... | G06F 15/7867 |
| | | | | 708/231 |
| 8,338,709 B2* | 12/2012 | Kodama | ............... | H01B 7/0838 |
| | | | | 174/110 R |
| 2011/0165839 A1* | 7/2011 | Kawamura | ............... | G01S 7/032 |
| | | | | 455/41.1 |

* cited by examiner

HIGH FREQUENCY SIGNAL TRANSMISSION DEVICE

BACKGROUND OF THE INVENTION

1. Field of the Invention

The instant disclosure relates to a high frequency signal transmission device, and more particularly to a high frequency signal transmission device using a flexible flat cable as a transmission medium.

2. Description of Related Art

Since the electrical connector is mainly used to achieve an electrical connector between two electric devices, the operation quality of an electronic system depends on the characteristics of the electrical connector. The electrical connector is a passive connection component in the electronic system and its development and promotion follow that of the CPU of computer. More specifically, the speed of CPU is continuously increased, from the early 33 MHz, 66 MHz, to Pentium III 500 MHz, and to the latest Pentium 4 3.06 GHZ, and the electronic signal transmission speed of the motherboard and computer peripherals is increased accordingly.

The signal transmission becomes more and more important with the development of multimedia audio and video. Although the coaxial cable can be used in electronic products to transmit high frequency signals, it has high production cost and relatively high price. Thus, the practicians of the industry try to replace the coaxial cable with a flexible flat cable. However, it is difficult for conventional flexible flat cables to achieve high frequency electrical characteristics. In addition, conventional flexible flat cables are unfavorable for miniaturizing electronic products.

SUMMARY OF THE INVENTION

One aspect of the instant disclosure relates to a high frequency signal transmission device having the advantages of high performance, low cost, and good usability.

According to one of the embodiments of the instant disclosure, the high frequency signal transmission device includes an insulation cover, at least one flexible flat cable, and an electrical connector assembly. The insulation cover has an accommodation space, the at least one flexible flat cable is disposed in the accommodation space, and the electrical connector assembly is electrically connected to one end of the at least one flexible flat cable. The at least one flexible flat cable includes a plurality of conductors, an insulation layer, a polyolefin resin layer, and a shielding layer. The insulation layer is laminated over the conductors. The polyolefin resin layer is attached to the insulation layer by a first low-k dielectric adhesive layer, and the shielding layer is attached to the polyolefin resin layer by another first low-k dielectric adhesive layer. The polyolefin resin layer has a thickness less than 100 μm, and the first low-k dielectric adhesive layers each have a dielectric constant (Dk) less than 3 and a dissipation factor (Df) less than 0.01.

In one embodiment, the sum of the thicknesses of the at least one flexible flat cable and the insulation cover is greater than 0 mm and less than 2.3 mm.

In one embodiment, the at least one flexible flat cable has an outer segment disposed in the accommodation space of the insulation cover and an inner segment exposed from the insulation cover, and the electrical connector assembly is connected to the outer segment.

In one embodiment, the at least one flexible flat cable includes two flexible flat cables laminated together, and the sum of the thicknesses of the two flexible flat cables and the insulation cover is greater than 0 mm and less than 3.0 mm.

In one embodiment, the high frequency signal transmission device further includes another electrical connector assembly electrically connected to the other end of the at least one flexible flat cable.

In one embodiment, the polyolefin resin layer is a PE layer.

In one embodiment, the first low-k dielectric adhesive layers each have a thickness between 5 μm and 20 μm.

In one embodiment, the insulation layer includes a second low-k dielectric adhesive layer and two PET layers respectively attached to two opposite surfaces of the second low-k dielectric adhesive layer, and the conductors are spaced at intervals from each other and encompassed by the second low-k dielectric adhesive layer and are between the PET layers.

In one embodiment, the second low-k dielectric adhesive layer has a thickness between 5 μm and 100 μm and the PET layers each have a thickness between 10 μm and 60 μm.

In one embodiment, the second low-k dielectric adhesive layer has a dielectric constant (Dk) less than 3 and a dissipation factor (Df) less than 0.01.

In one embodiment, the shielding layer has a thickness between 5 μm and 25 μm.

In one embodiment, the high frequency signal transmission device further includes a protective layer attached to the shielding layer by an adhesive layer.

In one embodiment, the protective layer has a thickness between 5 μm and 200 μm and the adhesive layer has a thickness between 5 μm and 25 μm.

In one embodiment, the high frequency signal transmission device is configured for use in a frequency range between 5 GHZ and 20 GHZ.

Based on the above, the high frequency signal transmission device includes an insulation cover and at least one flexible flat cable disposed in an accommodation space of the insulation cover, wherein the at least one flexible flat cable includes a polyolefin resin layer attached to the insulation layer by a first low-k dielectric adhesive layer and a shielding layer attached to the polyolefin resin layer by another first low-k dielectric adhesive layer, and the polyolefin resin layer has a thickness less than 100 μm and the first low-k dielectric adhesive layers each have a dielectric constant (Dk) less than 3 and a dissipation factor (Df) less than 0.01. Accordingly, the high frequency signal transmission device can meet the transmission requirements of high frequency signals, and has high practicality due to the presence of the flexible flat cable having the advantages of low cost, small volume, good usability, and high reliability.

To further understand the techniques, means and effects of the instant disclosure, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DETAILED DESCRIPTION OF THE PREFERRED EMBODIMENTS

Embodiments of a high frequency signal transmission device according to the instant disclosure are described herein. Other advantages and objectives of the instant disclosure can be easily understood by one skilled in the art from the disclosure. The instant disclosure can be applied to different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

Notably, the terms first, second, third, etc., may be used herein to describe various elements or signals, but these elements or signals should not be affected by such elements or terms. Such terminology is used to distinguish one element from another or a signal with another signal. Further, the term "or" as used herein in the case may include any one or combinations of the associated listed items.

First Embodiment

Figure 1:
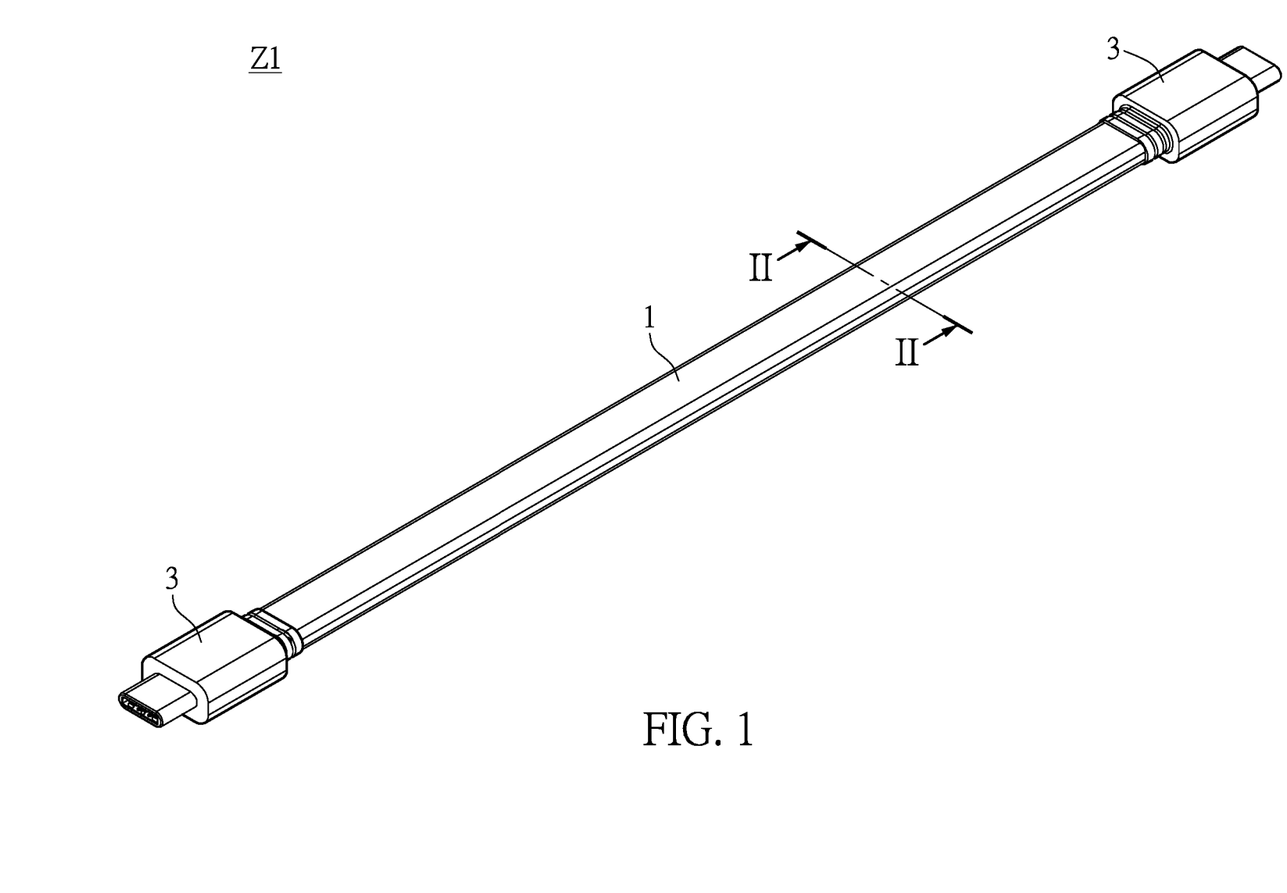
FIG. 1 is a three-dimensional view of a high frequency signal transmission device according to the first embodiment of the instant disclosure.
Figure 2:
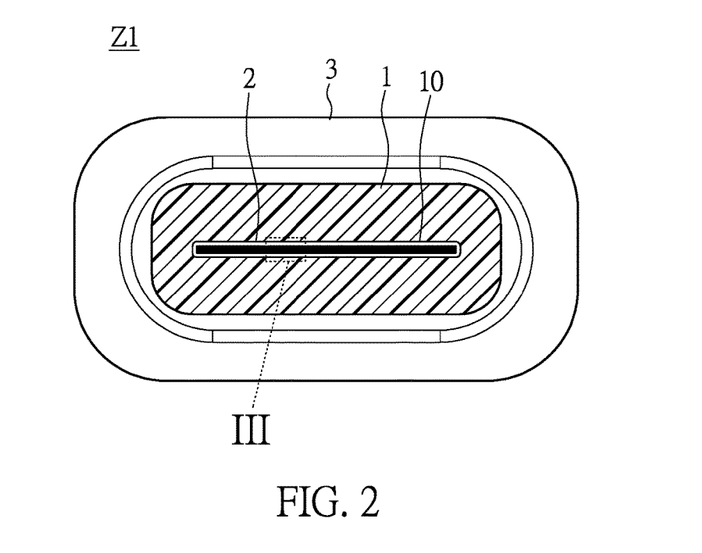
FIG. 2 is a cross-sectional view taken along the section line II-II of FIG. 1.
Figure 3:
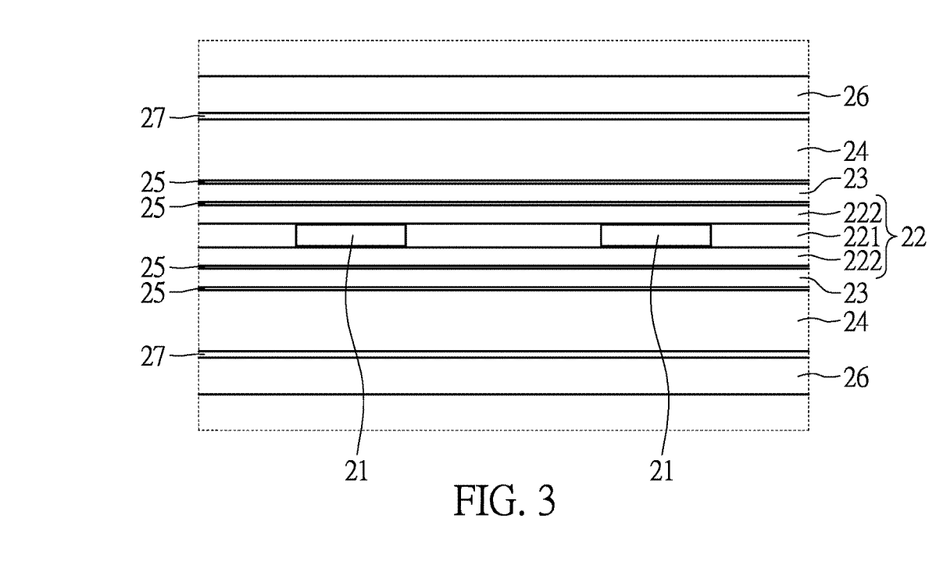
FIG. 3 is an enlarged view taken on part III of FIG. 2.

Referring to FIGS. 1 to 3, FIG. 1 is a three-dimensional view of the high frequency signal transmission device according to the first embodiment of the instant disclosure, FIG. 2 is a cross-sectional view taken along the section line II-II of FIG. 1, and FIG. 3 is an enlarged view taken on part III of FIG. 2. The high frequency signal transmission device Z1, as shown in the above FIGS, includes an insulation cover 1, a flexible flat cable (FFC) 2 and two electrical connector assemblies 3. The insulation cover 1 has an accommodation space 10, the flexible flat cable 2 is disposed in the accommodation space 10, and the electrical connector assemblies 3 are connected to two ends of the flexible flat cable 2. By virtue of the above configuration, the sum of the thicknesses of the insulation cover 1 and the single flexible flat cable 2 can be controlled within a range from greater than 0 mm to less than 2.3 mm.

The high frequency signal transmission device Z1 can be a bridge for electrically connecting two electric devices (not shown). More specifically, when in use, electrical plugs (not numbered) of the electrical connector assemblies 3 respectively come into contact with electrical receptacles of the electric device to allow of the transmission of electric current and signals. Since the components, such as electrical plug (e.g., USB Type-C plug or other types of USB plugs), inner PCB, and insulation housing, of the electrical connector assemblies 3 are well known in the art, a detailed description thereof is omitted herein for the sake of brevity. It should be noted that the flexible flat cable 2 is integrated in the high frequency signal transmission device Z1 to be used as a transmission medium of high frequency signals. Accordingly, the high frequency signal transmission device Z1 has high practicality due to the presence of the flexible flat cable having the advantages of low cost, small volume, good usability, and high reliability.

Referring to FIG. 2, the flexible flat cable 2 of the high frequency signal transmission device Z1 is made of a special laminate and is encapsulated in the insulation cover 1. The insulation cover 1 has high temperature, moisture and corrosion resistance so that the lifetime of the flexible flat cable 2 can be prolonged. Preferably, the insulation cover 1 can be made of a material having a dielectric constant approximately equal to that of air. Accordingly, the transmitted signals cannot be easily affected by the variation of an external environment so that the signal transmission delay and interference between signals can be minimized to ensure the effective transmission of signals.

Referring to FIG. 3, the flexible flat cable 2 includes a plurality of conductors 21, an insulation layer 22, two polyolefin resin layers 23, and two shielding layers 24. The insulation layer 22 is laminated over the conductors 21. The two polyolefin resin layers 23 are respectively attached to upper and lower surfaces of the insulation layer 22. The two shielding layers 24 are respectively attached to two exterior surfaces of the two polyolefin resin layers 23. It should be noted that the insulation layer 22, the polyolefin resin layers 23, and the shielding layers 24 are laminated together with first low-k dielectric adhesive layers 25. More specifically, each of the polyolefin resin layers 23 and the insulation layer 22 are fixedly connected to each other by a first low-k dielectric adhesive layer 25, and each of the shielding layers 24 and the corresponding polyolefin resin layer 23 are fixedly connected to each other by another first low-k dielectric adhesive layer 25. Accordingly, the first low-k dielectric adhesive layers 25 have low dielectric loss in a high frequency region so that the thickness of the polyolefin resin layers 23 can be reduced, and thus the flexible flat cable 2 can have the advantages of small size and low cost.

Furthermore, the first low-k dielectric adhesive layers 25 have a dielectric constant (Dk) less than 3, preferably between 1 and 3, and a dissipation factor (Df) less than 0.01 preferably between 0.00001 and 0.01. The first low-k dielectric adhesive layers 25 each have a thickness between 5 μm and 20 μm. Particularly, the remarkable miniaturization of the flexible flat cable 2 can be performed when the polyolefin resin layers 23 are made of polyethylene (PE). Compared to the conventional FFC in which the low-k dielectric layer must have a thickness greater than 100 μm to achieve the desired characteristic impedance, the thickness of the polyolefin resin layers 23 of the flexible flat cable 2 can be reduced to less than 100 μm.

In the instant embodiment, the conductors 21 can be made of metal foils such as copper foil or tinned copper foil. Please note that the width and thickness of the conductors 21 may be varied according to cable specifications. In view of flexibility of the flexible flat cable 2, the thickness of the conductors 1 preferably ranges from 20 μm to 50 μm. The insulation layer 22 includes a second low-k dielectric adhesive layer 221 and two PET layers 222 respectively attached to two opposite surfaces (i.e., upper and lower surfaces) of the second low-k dielectric adhesive layer 221. The conductors 21 are spaced at intervals from each other and encompassed by the second low-k dielectric adhesive layer 221 and are between the two PET layers 222.

Furthermore, in view of electrical and mechanical properties and cost, the second low-k dielectric adhesive layer 221 has a thickness between 5 μm and 100 μm, and each of the PET layers 222 has a thickness between 10 μm and 60 μm. Preferably, the second low-k dielectric adhesive layer 221 has the same dielectric properties as the first low-k dielectric adhesive layers 25 has. That is to say, the second low-k dielectric adhesive layer 221 also has a dielectric constant (Dk) less than 3, preferably between 1 and 3, and a dissipation factor (Df) less than 0.01, preferably between 0.00001 and 0.01. Accordingly, the thickness of the polyolefin resin layers 23 can be further reduced.

In practice, the first and second low-k dielectric adhesive layers 25, 221 can be made of a pressure-sensitive low-k dielectric adhesive composition which includes (A) from 100 to 120 parts by weight of a vinyl compound or polymer, (B) from 8 to 75 parts by weight of a copolymer of styrene, butadiene and divinylbenzene, (C) from 30 to 110 parts by weight of a flame retardant, and (D) from 0.1 to 10 parts by weight of a peroxide. There are no specific restrictions for the components (A) to (D). For example, the component (A) can be selected from one or any combination of vinylpolyphenylene ether, maleimide, divinylbenzene, divinylbenzylether, triallyl isocyanurate, diallyl bisphenol A, and maleimide prepolymer. The component (C) can be selected from one or any combination of phosphorus containing, nitrogen containing and halogen containing flame retardants. The component (D) can be selected from dicumyl peroxide and any organic peroxide containing tert-butyl group.

The first and second low-k dielectric adhesive layers 25, 221 can be made of another pressure-sensitive low-k dielectric adhesive composition which includes (A) from 115 to 135 parts by weight of a polyester resin or its elastomer, (B) from 15 to 60 parts by weight of a copolymer of styrene, butadiene and maleic anhydride, (C) from 30 to 110 parts by weight of a flame retardant, and (D) from 0.1 to 10 parts by weight of a peroxide. There are no specific restrictions for the components (A) to (D). For example, the component (A) can be selected from polyethylene terephthalate (PET), polybutylene terephthalate (PBT), and the combination thereof. The component (C) can be selected from one or any combination of phosphorus containing, nitrogen containing and halogen containing flame retardants. The component (D) can be selected from dicumyl peroxide and any organic peroxide containing tert-butyl group.

The first and second low-k dielectric adhesive layers 25, 221 can be made of still another pressure-sensitive low-k dielectric adhesive composition which includes (A) from 135 to 150 parts by weight of a polyamide resin or its elastomer, (B) from 10 to 50 parts by weight of a vinyl functional polybutadiene urethane oligomer, (C) from 30 to 110 parts by weight of a flame retardant, and (D) from 0.1 to 10 parts by weight of a peroxide. There are no specific restrictions for the components (A) to (D). For example, the component (A) can be nylon. The component (C) can be selected from one or any combination of phosphorus containing, nitrogen containing and halogen containing flame retardants. The component (D) can be selected from dicumyl peroxide and any organic peroxide containing tert-butyl group.

Please note that said pressure-sensitive low-k dielectric adhesive composition may further include at least one additive selected from the group consisting of hardening accelerators, solvents, crosslinking agents, coupling agents, surfactants, tougheners, inorganic fillers and any combination thereof. The aforementioned additives may be commercially available from sources known by those of ordinary skill in the art, or obtained according to conventional methods well known in the art. Unless otherwise defined or specified, all technical and scientific terms used herein have the same meanings known by those skilled in the art. In addition, any process or material similar or equivalent to those cited herein may be used in said pressure-sensitive low-k dielectric adhesive composition.

The polyolefin resin layers 23 have the properties of low dielectric loss, high flexibility and good processability. Each of the polyolefin resin layers 23 can be made of polyethylene (PE), acid-modified polyethylene, polypropylene (PP), acid-modified polypropylene, ethylene-vinyl acetate (EVA), ethylene-methacrylic acid methyl random copolymer (EMMA), ethylene-ethyl acrylate (EEA), ethylene-methacrylic acid copolymer (EMAA), polyionic polymer, or any combination thereof. Please note that each of the polyolefin resin layers 23 can be provided with a flame retardant to improve its flame resistance, wherein the content of the flame retardant amounts to from 30 to 80 parts by weights per 100 parts by weight of the corresponding polyolefin resin layer 23. The flame retardant can be selected from one or any combination of inorganic flame retardants, phosphorus containing, nitrogen containing and halogen containing flame retardants, and metal powders.

The shielding layers 24 are configured to reduce electromagnetic interference and noise. Each of the shielding layers 24 can be a metal layer made of copper, aluminum, silver, or an alloy thereof. In view of availability and cost, each of the shielding layers 24 has a thickness between 5 μm and 25 μm.

Referring to FIG. 3, the flexible flat cable 2 can further include two protective layers 26 over two exterior surfaces of the shielding layers 24 respectively. Specifically, each of the protective layers 26 and the corresponding shielding layer 24 are fixedly connected to each other by an adhesive layer 27 formed by any pressure-sensitive adhesive composition known by those of ordinary skill in the art. Each of the protective layers 26 can be made of thermoplastic or thermosetting insulation material. Specific examples of the thermoplastic insulation material include, but are not limited to, PE, PVC, LDPE, HDPE, PP, PU, nylon, and teflon. Specific examples of the thermosetting insulation material include, but are not limited to, SBR, NBR, EPR, EPT, and silicon rubber. In view of availability and cost, each of the protective layers 26 has a thickness between 5 μm and 200 μm.

Second Embodiment

Figure 4:
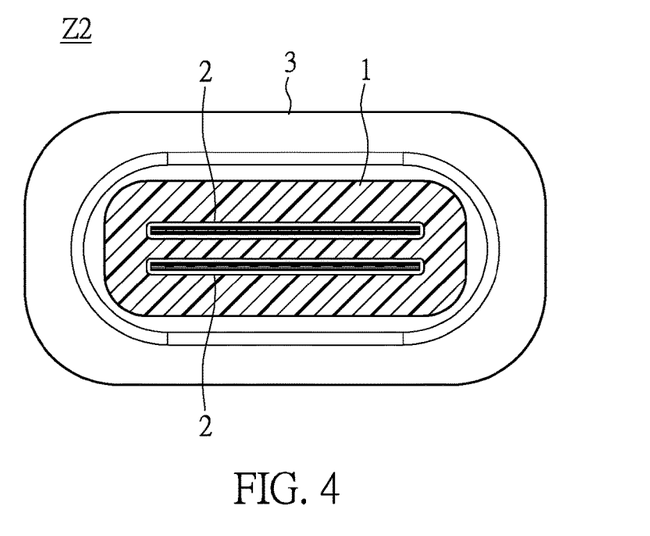
FIG. 4, which is similar to FIG. 2, is a cross-sectional view of the high frequency signal transmission device according to the second embodiment of the instant disclosure.

Referring to FIG. 4, this is a cross-sectional view of the high frequency signal transmission device according to the second embodiment of the instant disclosure. To comply with the specific transmission power and transmission speed specifications, the high frequency signal transmission device Z2 includes two flexible flat cables 2 electrically connected between the two electrical connector assemblies 3, wherein the two flexible flat cables 2 are laminated together and are encapsulated in the insulation cover 1. By virtue of the above configuration, the sum of the thicknesses of the insulation cover 1 and the two flexible flat cables 2 can be controlled within a range from greater than 0 mm to less than 2.5 mm.

While in the high frequency signal transmission device Z2 as shown in FIG. 4, the two flexible flat cables 2 are isolated by an insulation filler which is formed in the overmolding process of the insulation cover 1, the isolation structure may be varied according to practical needs. For example, the two flexible flat cables 2 can be laminated together by an insulation adhesive layer.

Third Embodiment

Figure 5:
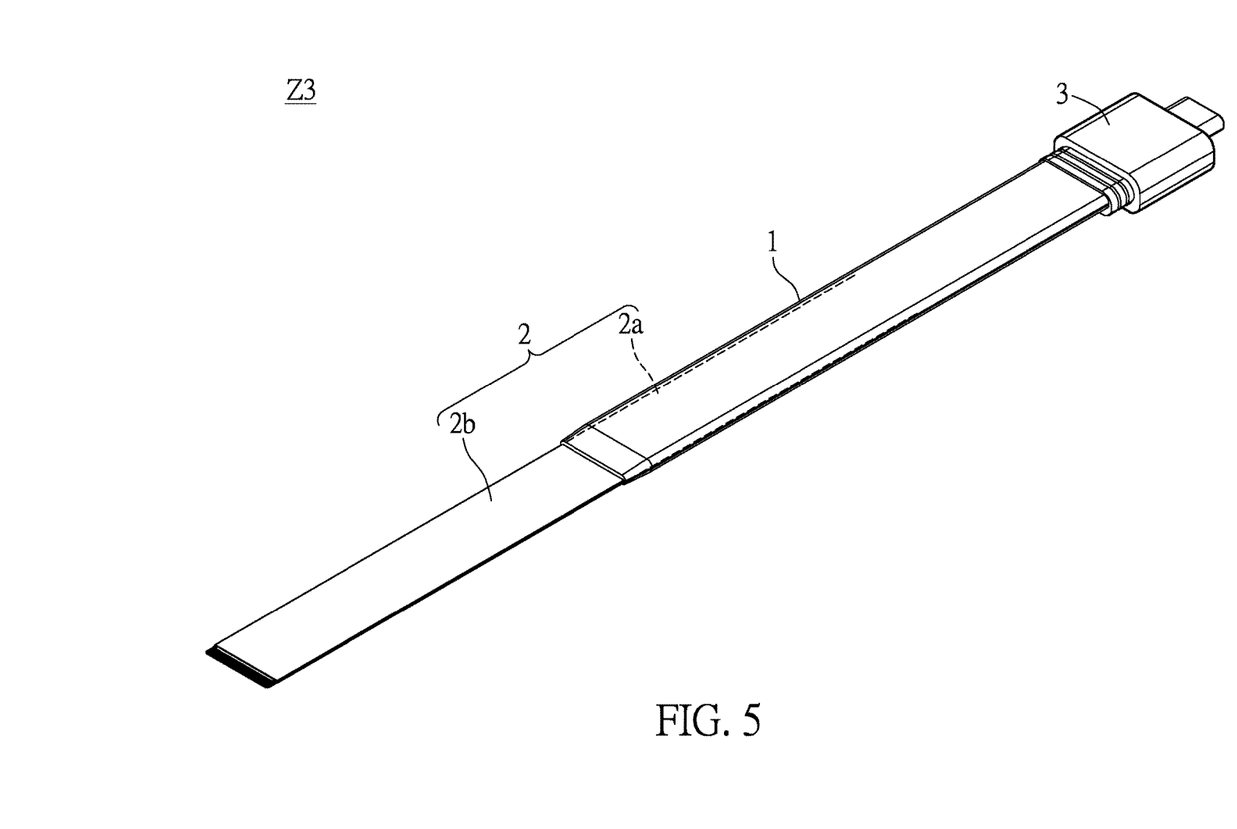
FIG. 5 is a three-dimensional view of a high frequency signal transmission device according to the third embodiment of the instant disclosure.

Referring to FIG. 5, this is a three-dimensional view of the high frequency signal transmission device according to the third embodiment of the instant disclosure. As shown in FIG. 5, the main difference between the first and third embodiments is that the flexible flat cable 2 of the high frequency signal transmission device Z3 has an outer segment 2a and an inner segment 2b. The outer segment 2a is disposed in the accommodation space 10 of the insulation cover 1. The inner segment 2b is exposed to an external environment (i.e., exposed from the insulation cover 1). By virtue of the above configuration, the sum of the thicknesses of the insulation cover 1 and the single flexible flat cable 2 can be controlled within a range from greater than 0 mm to less than 2.3 mm. In addition, the high frequency signal transmission device Z3 includes only one electrical connector assembly 3 connected to the outer segment 2a of the flexible flat cable 2.

More specifically, the high frequency signal transmission device Z3 in which the electrical connector assembly 3 connected to the outer segment 2a of the flexible flat cable 2 is directly plugged into an electric device, and the inner segment 2b of the flexible flat cable 2 has to be put into another electric device and then come into electrical contact with the electronic components of the another electric device. Accordingly, an electrical connection between the two electric devices can be achieved to allow of the transmission of electric current and signals.

Fourth Embodiment

Figure 6:
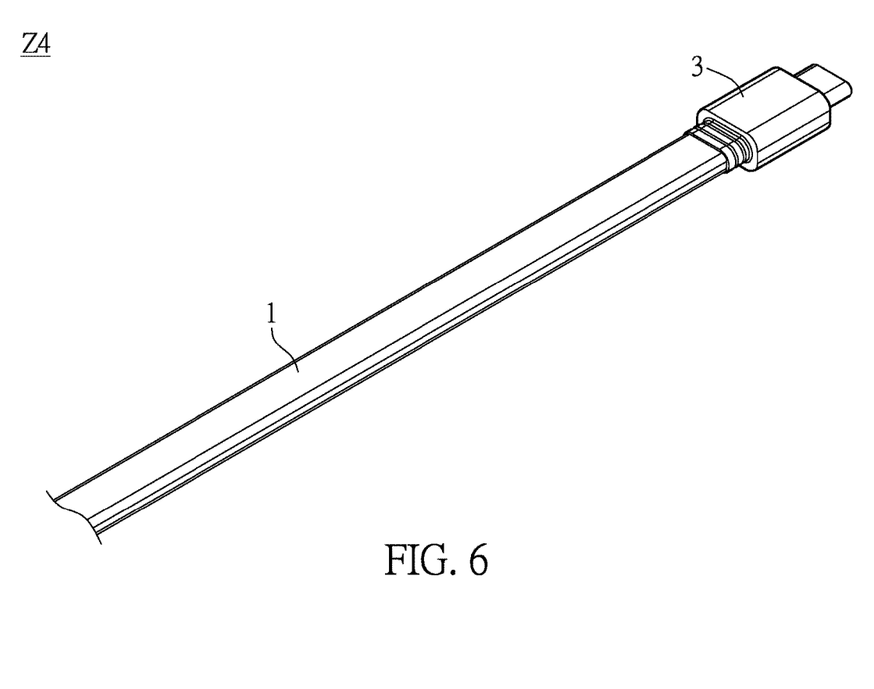
FIG. 6 is a three-dimensional view of a high frequency signal transmission device according to the fourth embodiment of the instant disclosure.

Referring to FIG. 6, this is a three-dimensional view of the high frequency signal transmission device according to the fourth embodiment of the instant disclosure. As shown in FIG. 6, the main difference between the first and third embodiments is that the high frequency signal transmission device Z4 includes only one electrical connector assembly 3 connected to one end of the flexible flat cable 2 to meet special needs.

Based on the above, the high frequency signal transmission device can meet the transmission requirements of high frequency signals, and can be configured for use in a frequency range between 5 GHZ and 20 GHZ.

The high frequency signal transmission device utilizes the flexible flat cable in its construction, so that it has high practicality due to the presence of the flexible flat cable having the advantages of low cost, small volume, good usability, and high reliability.

The insulation cover has high temperature, moisture and corrosion resistance so that the lifetime of the flexible flat cable can be prolonged.

The flexible flat cable of the high frequency signal transmission device is made of a special laminate, wherein the insulation layer, the polyolefin resin layers, and the shielding layers are laminated together with first low-k dielectric adhesive layers. The first low-k dielectric adhesive layers have low dielectric loss in a high frequency region, and thus the flexible flat cable can have the advantages of small size and low cost.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. A high frequency signal transmission device, comprising:
   an insulation cover having an accommodation space;
   at least one flexible flat cable disposed in the accommodation space, and including:
   a plurality of conductors;
   an insulation layer laminated over the conductors, wherein the insulation layer includes a second low-k dielectric adhesive layer and two PET layers respectively attached to two opposite surfaces of the second low-k dielectric adhesive layer, and wherein the conductors are spaced at intervals from each other, encompassed by the second low-k dielectric adhesive layer, and between the PET layers;
   a polyolefin resin layer attached to the insulation layer by a first low-k dielectric adhesive layer; and
   a shielding layer attached to the polyolefin resin layer by another first low-k dielectric adhesive layer;
   wherein the polyolefin resin layer has a thickness less than 100 μm, and the first low-k dielectric adhesive layers each have a dielectric constant (Dk) less than 3 and a dissipation factor (Df) less than 0.01; and
   an electrical connector assembly electrically connected to one end of the at least one flexible flat cable.

2. The high frequency signal transmission device of claim 1, wherein the sum of the thicknesses of the at least one flexible flat cable and the insulation cover is greater than 0 mm and less than 2.3 mm.

3. The high frequency signal transmission device of claim 2, wherein the at least one flexible flat cable has an outer segment disposed in the accommodation space of the insulation cover and an inner segment exposed from the insulation cover, and wherein the electrical connector assembly is connected to the outer segment.

4. The high frequency signal transmission device of claim 1, wherein the at least one flexible flat cable includes two flexible flat cables laminated together, and wherein the sum of the thicknesses of the two flexible flat cables and the insulation cover is greater than 0 mm and less than 3.0 mm.

5. The high frequency signal transmission device of claim 4, further comprising another electrical connector assembly electrically connected to the other end of the at least one flexible flat cable.

6. The high frequency signal transmission device of claim 1, wherein the polyolefin resin layer is a PE layer.

7. The high frequency signal transmission device of claim 1, wherein the first low-k dielectric adhesive layers each have a thickness between 5 μm and 20 μm.

8. The high frequency signal transmission device of claim 1, wherein the second low-k dielectric adhesive layer has a thickness between 5 μm and 100 μm and the PET layers each have a thickness between 10 μm and 60 μm.

9. The high frequency signal transmission device of claim 8, wherein the second low-k dielectric adhesive layer has a dielectric constant (Dk) less than 3 and a dissipation factor (Df) less than 0.01.

10. The high frequency signal transmission device of claim 1, wherein the shielding layer has a thickness between 5 μm and 25 μm.

11. The high frequency signal transmission device of claim 1, further comprising a protective layer attached to the shielding layer by an adhesive layer.

12. The high frequency signal transmission device of claim 11, wherein the protective layer has a thickness between 5 μm and 200 μm and the adhesive layer has a thickness between 5 μm and 25 μm.

13. The high frequency signal transmission device of claim 1, which is configured for use in a frequency range between 5 GHZ and 20 GHZ.

14. A high frequency signal transmission device, comprising:
   an insulation cover having an accommodation space;
   at least one flexible flat cable disposed in the accommodation space, and having an outer segment disposed in the accommodation space and an inner segment exposed from the insulation cover, wherein the at least one flexible flat cable includes:
   a plurality of conductors;
   an insulation layer laminated over the conductors;
   a polyolefin resin layer attached to the insulation layer by a first low-k dielectric adhesive layer; and
   a shielding layer attached to the polyolefin resin layer by another first low-k dielectric adhesive layer;
   wherein the polyolefin resin layer has a thickness less than 100 μm, and the first low-k dielectric adhesive layers each have a dielectric constant (Dk) less than 3 and a dissipation factor (Df) less than 0.01; and
   an electrical connector assembly connected to the outer segment;
   wherein the sum of the thicknesses of the at least one flexible flat cable and the insulation cover is greater than 0 mm and less than 2.3 mm.

15. The high frequency signal transmission device of claim 14, wherein the polyolefin resin layer is a PE layer.

16. The high frequency signal transmission device of claim 14, wherein the first low-k dielectric adhesive layers each have a thickness between 5 μm and 20 μm, and the shielding layer has a thickness between 5 μm and 25 μm.

17. A high frequency signal transmission device, comprising:
   at least one flexible flat cable disposed in the accommodation space, and including:
   a plurality of conductors;
   an insulation layer laminated over the conductors;
   a polyolefin resin layer attached to the insulation layer by a first low-k dielectric adhesive layer; and
   a shielding layer attached to the polyolefin resin layer by another first low-k dielectric adhesive layer;
   wherein the polyolefin resin layer has a thickness less than 100 μm, and the first low-k dielectric adhesive layers each have a dielectric constant (Dk) less than 3 and a dissipation factor (Df) less than 0.01;
   an electrical connector assembly electrically connected to one end of the at least one flexible flat cable; and
   a protective layer attached to the shielding layer by an adhesive layer, wherein the protective layer has a thickness between 5 μm and 200 μm and the adhesive layer has a thickness between 5 μm and 25 μm.

18. The high frequency signal transmission device of claim 17, wherein the polyolefin resin layer is a PE layer.

19. The high frequency signal transmission device of claim 17, wherein the first low-k dielectric adhesive layers each have a thickness between 5 μm and 20 μm, and the shielding layer has a thickness between 5 μm and 25 μm.

* * * * *